United States Patent [19]
Fudim

[11] Patent Number: 4,752,498
[45] Date of Patent: Jun. 21, 1988

[54] METHOD AND APPARATUS FOR PRODUCTION OF THREE-DIMENSIONAL OBJECTS BY PHOTOSOLIDIFICATION

[76] Inventor: Efrem V. Fudim, 4815 N. Marlborough Dr., Milwaukee, Wis. 53217

[21] Appl. No.: 20,764

[22] Filed: Mar. 2, 1987

[51] Int. Cl.$^4$ .............................................. B05D 3/06
[52] U.S. Cl. ................................... 427/54.1; 264/22; 425/174.4; 430/321
[58] Field of Search ................... 264/1.4, 1.7, 2.3, 2.7, 264/22; 425/174, 174.4, 174.6; 430/321; 427/54.1

[56] References Cited
U.S. PATENT DOCUMENTS

| | | |
|---|---|---|
| 4,137,081 | 1/1979 | Pohl . |
| 4,139,654 | 2/1979 | Reed ..................... 264/22 |
| 4,174,218 | 11/1979 | Pohl . |
| 4,228,232 | 10/1980 | Rousseau . |
| 4,376,160 | 3/1983 | Evanchuk ............ 430/321 |
| 4,472,020 | 9/1984 | Evanchuk ............ 430/321 |
| 4,575,330 | 3/1986 | Hull . |

FOREIGN PATENT DOCUMENTS 626967 9/1978 U.S.S.R. ................................. 264/1.7
626968 9/1978 U.S.S.R. ................................. 264/1.7

OTHER PUBLICATIONS

U.S. patent application Ser. No. 06/682,090 filed Dec. 17, 1984, titled "Method of Fabricating Fluidic Plates and Devices by Irradiation of Photopolymers".
Fudim, Efrem, "A New Method of Three-Dimensional Micromachining," *Mechanical Engineering*, Sep. 1985.
Fudim, Efrem, "Sculpting with Light," *Machine Design*, Mar. 6, 1986.

*Primary Examiner*—John H. Newsome
*Attorney, Agent, or Firm*—Quarles & Brady

[57] ABSTRACT

An improved method of forming three-dimensional objects comprises irradiating an uncured photopolymer by transmitting an effective amount of photopolymer solidifying radiation through a radiation transmittent material which is in contact with the uncured photopolymer. The transmittent material is a material which leaves the irradiated surface capable of further crosslinking so that when a subsequent layer is formed it will adhere thereto. Using this method multilayer objects can be made.

27 Claims, 2 Drawing Sheets

METHOD AND APPARATUS FOR PRODUCTION OF THREE-DIMENSIONAL OBJECTS BY PHOTOSOLIDIFICATION

RELATED DISCLOSURE STATEMENT

A disclosure document No. 160,694 describing the invention was filed with the U.S. Patent Office on Dec. 16, 1986.

FIELD OF THE INVENTION

This invention relates generally to improvements in a method and apparatus for production of three-dimensional objects. More specifically, it relates to a method and apparatus for forming three-dimensional objects by the irradiation of photopolymers that solidify in response to radiation.

BACKGROUND OF THE INVENTION

All of the commonly practiced processes for fabricating three-dimensional objects have disadvantages. For example, the mechanical removal of material to form such objects involves much energy, time and processing; the chemical machining to form such objects has depth limitations and the incapability of making complex shapes; and the thermal molding requires expensive molds; it is very inflexible and it takes much time and energy.

Several methods and apparatus have been developed for the production of three-dimensional objects by irradiation of photopolymers that cross-link and solidify upon irradiation. Forming three-dimensional objects by solidifying each point individually can be accomplished by scanning the whole volume of the object point by point with intersecting beams, as described, for example, in U.S. Pat. Nos. 4,041,476 and 4,288,861. However, such methods are very complex and expensive. The forming of three-dimensional objects by building-up successive extremely thin laminae of the solidified photopolymer is described in U.S. Pat. No. 4,575,330. The method involves many production steps due to the large number of laminae required. As a result the system can be time consuming and complex. There also are other drawbacks such as shrinkage distortion of the open irradiated surface.

An article "A New Method of Three Dimensional Micromachining" published in the September 1985 issue of Mechanical Engineering describes the fabrication of three-dimensional objects in a single irradiation process using a mask modulating the intensity of radiation across the irradiated surface to vary depth of solidification. However, only objects with a single layer of cavities which are limited in geometry can be produced. More complex objects, and objects of larger thickness, can only be made by forming separate slices and later attaching them together. To provide a good surface for joining the slices together, the irradiated surface is covered with a rigid glass plate to which the solidified polymer adheres. However, the glass causes the polymer surface which it contacts to lose some of its cross-linking capability which makes it difficult to join the slices together.

In my article "Sculpting with Light" published Mar. 6, 1986 in Machine Design, I have described the use of a radiation source that modulates the amount of radiation across the irradited surface to vary depths of solidification, the formulae for calculating the required light intensity for solidification, and related matter. That article is incorporated by reference herein.

Three-dimensional objects of various geometries are widely used everywhere in final products, prototypes and models. A large portion of such objects could be made of photopolymers by photosolidification if there were a suitable apparatus and method of producing these objects which resulted in dramatic reductions in cost and time and improvements in accuracy and performance characteristics.

SUMMARY OF THE INVENTION

The primary objects of the present invention are to provide an improved apparatus and method for making three-dimensional objects by the photosolidification of photopolymers.

The preferred method of the present invention for generating three-dimensional objects from a photopolymer capable of solidification in response to radiation comprises providing a quantity of uncured photopolymer in a container. A rigid radiation transmittent plate, which has a bottom coating to which the solidified polymer will not adhere and which does not prevent the cross-linking further of the polymer, is supported on the top surface of the photopolymer. Next, an effective amount of photopolymer solidifying radiation is then transmitted through the plate into the uncured photopolymer, causing the photopolymer exposed to the light to solidify as a three-dimensional object. The thus obtained object of solidified polymer can be enlarged, if desired, by repeating the procedure, i.e. adding more photopolymer onto the object, repositioning the plate and repeating the irradiation.

By applying modulated radiation, complex three-dimensional objects can be formed during each procedure. But, the objects are limited in thickness or accuracy and can have only one layer of cavities.

To form more complex, thicker or more accurate objects, or to avoid the complicated modulation otherwise necessary in some cases, individual slices of an objects are successively built up one atop of another. This is possible with the method of the present invention because the irradiated surfaces of the solidified photopolymer, which are in contact with the coating on the glass plate, retain sufficient cross-linking capability after the initial irradiation and each subsequent slice automatically adheres to the preceding one to form combination objects.

The simplest form of the novel apparatus of the present invention includes a container for the uncured photopolymer; relatively rigid transparent plate adapted to rest upon the top surface of the uncured photopolymer, which plate has a bottom surface to which the solidified polymer will not adhere and which does not interfere with the further crosslinking of the polymer; one or more masks to modulate radiation, which can be a part of the plate or a separate item; and a source of photopolymer solidifying radiation. The preferred apparatus also includes a removable substrate in the container upon which the solidified photopolymer can rest.

In another embodiment of the apparatus the substrate is transparent and there is a source of radiation for transmitting radiation through the substrate. If the substrate has a surface in contact with the polymer that does not prevent further cross-linking, the apparatus can be used to prepare objects that can be stacked upon each other and further cured to bind them together.

DESCRIPTION OF THE PREFERRED EMBODIMENT

The invention will now be described in connection with the drawings.

Figure 1:
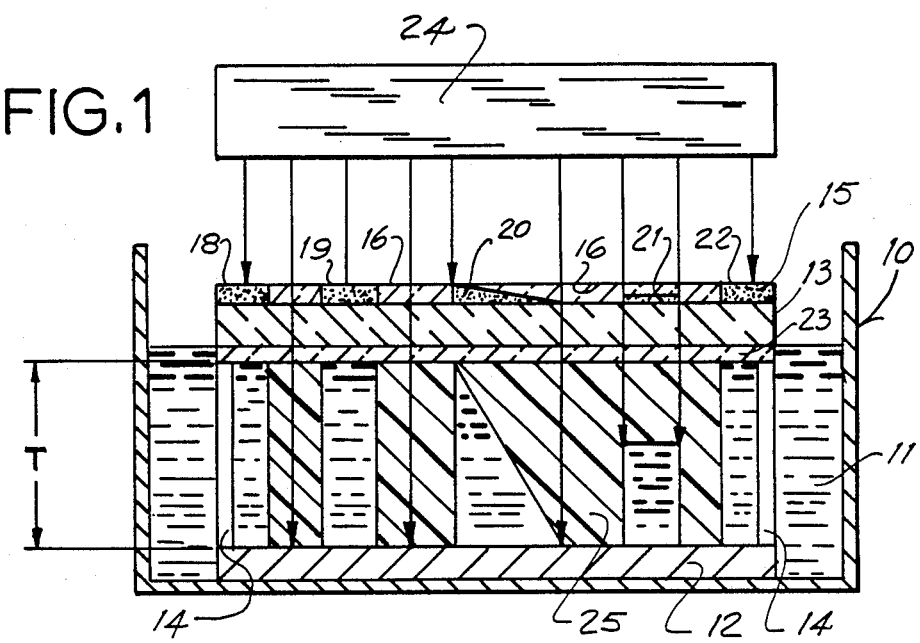
FIG. 1 is a view, partly in section, of a preferred embodiment of the apparatus of the invention.

As seen in FIG. 1, a container 10 is partially filled with an uncured photopolymer 11 that solidifies when irradiated, preferrably with ultraviolet (UV) or similar radiation. Secured in the container 10 is a substrate 12. A radiation-transmitting, rigid plate 13 is supported on the top surface of the liquid photopolymer 11 by supports 14, only two of which can be seen. The distance between substrate 12 and plate 13 is equal to the desired thickness (T) of the object to be formed.

The plate 13 covers the top surface of the photopolymer 11 so no air is entrapped between the plate 13 and the top surface of the photopolymer 11. Plate 13 should be rigid enough to provide desired shape for the top surface of the polymer and to keep it unchanged during solidification. Plate 13 should preferably not seal the container so that fluid volume changes resulting from solidification are made up by unrestricted supply of fluid from around the irradiated area. Resting on the top surface of the plate 13 is a mask 15 which has transparent areas 16 and areas of different opacity 18, 19, 20, 21 and 22. The bottom of the transparent plate, which is either glass or quartz, has a transparent coating 23 which does not substantially interfere with the ability of the photopolymer to further cross-link and can be removed after irradiation. Positioned above the mask 15 is a source of photopolymer solidifying radiation 24.

When it is desired to make a desired three-dimensional object with the described apparatus, radiation from the light source 24 is transmitted through the mask 15, plate 13 and coating 23 into the uncured photopolymer 11 to selectively solidify it and form a three-dimensional solid object 25 (seen in cross-section) which is adhered or attached to substrate 12.

The more radiant energy which is applied the greater is the depth of solidification. As is apparent from FIG. 1, no solidification occurs where the amount of energy is below a minimal value (e.g. below areas 18, 19 and 22); where the minimal amount of energy penetrates only to a partial depth, partial solidification occurs (e.g. below area 21); where the amount of energy changes abruptly from one value to another, a 90° wall is formed; and, where the amount of energy changes gradually, an inclined wall is created (e.g. below area 20).

In the simplest case of on-off irradiation, if an effective amount of radiation is applied to some areas while none or below the minimal amount to others, a planar object featuring exclusively through-holes and 90° walls is produced.

Figures 3A, 3B:
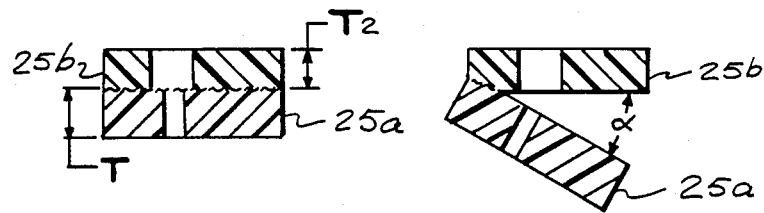
FIG. 3A is a schematic view of a multilayer object formed by the method of the invention.
FIG. 3B is a schematic view of an object formed by one embodiment of my method.

Additional layers are added to enlarge the object by removing the plate 13, adding more photopolymer on top of the object, replacing the same or a different plate 13 and selectively irradiating the uncured photopolymer to obtain an object as seen in FIG. 3A. This process can be repeated many times.

When the irradiation is complete, the plate 13 with its coating 23 and mask 15 are slid off and the solidified object 25, with or without the substrate 12 upon which it rests are taken out of container 10. Excess unsolidified polymer 11 is removed using alcohol, water with detergent or other suitable solvent. The object 25 is dried, for example by using warm air jets, and subjected to additional irradiation, if necessary, to complete the cross-linking. The object 25 can be peeled off of the substrate 12 either before or after removing unsolidified photopolymer.

Figure 2:
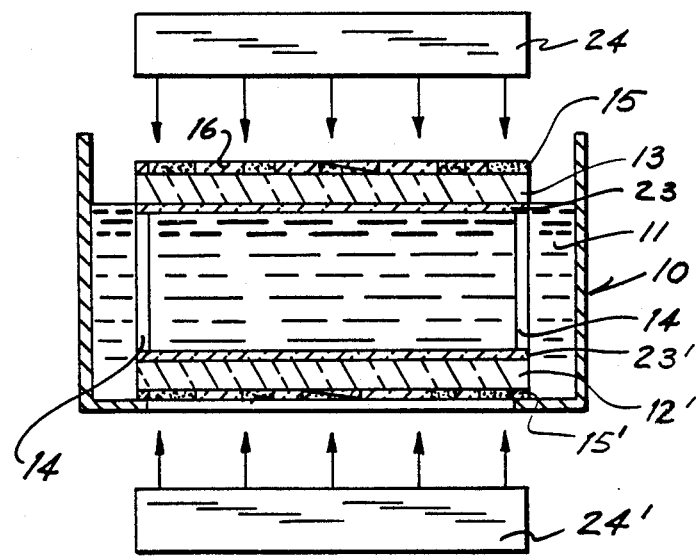
FIG. 2 is a similar view of a second embodiment.

In the embodiment of FIG. 2 all the components are the same except for the substrate 12'. In this apparatus the substrate 12' is transparent and it has a coating 23' similar to 23. In addition, there is a second mask 15' and a second radiation source 24' positioned below the container so that the photopolymer can be irradiated from both above and below. With irradiation from the bottom and no coating 23' on plate 12, the apparatus of FIG. 2 can be used to build an object 25 similarly to the apparatus of FIG. 1.

The object 25 shown in FIG. 3B can be made by first making the bottom portion 25a, removing plate 13, turning substrate 12 with 25a attached clockwise by angle α, adding photopolymer, replacing plate 13 and irradiating to form portion 25b.

Although liquid photopolymer is preferred, almost any liquid or sheet polymer that is uncured and can be solidified with radiation can be used in the process. Usually, light-sensitive additives are used to reduce required energy. Common additives are benzophenone derivatives, quinones, benzol, benzoin ethers, and halogenated compounds. Photopolymer in sheet form like Templex, from E. I. du Pont, Wilmington, Del. also can be used instead of the liquid polymer. A preferred photopolymer liquid for use in the present invention is Magnacryl 2296 made by Beacon Chemical Company of Mount Vernon, N.Y. Suitable polymers are disclosed in U.S. Pat. Nos. 4,228,232; 4,174,218; and 4,137,081 which are incorporated by reference herein.

A suitable radiation source is an assembly of General Electric lamps emitting UV light in the range of about 200 to about 500 nm, and preferably about 300 nm to about 400 nm, and providing intensity of several mw/cm$^2$ at the top surface of the photopolymer. Mercury lamps, lasers, cathode ray tubes or other radiation sources, quartz or other radiation-transmitting materials and different automatically controlled actuators for scanning with an aperture or an optical fiber, also can be used. For high accuracy and resolution the radiation should be collimated.

Figure 4A:
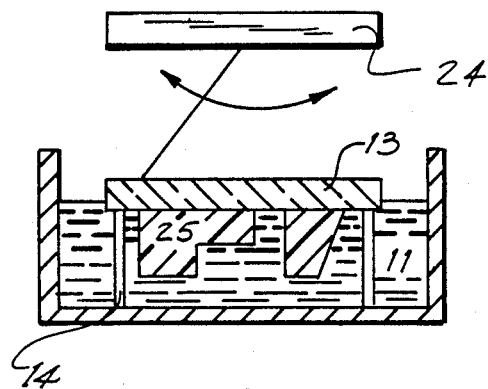
FIG. 4A and 4B are schematic views showing the use of a modulating radiation source.
Figure 4B:
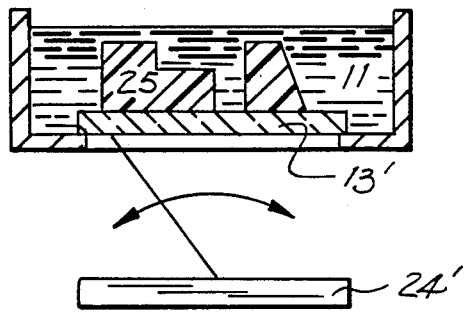

The radiation source can also be one that scans (by deflecting the beams as in CRT or by moving the source 24 and/or container 10) and modulates. As seen in FIG. 4A and 4B, if such a radiation is used, there is no need for a mask 15. Substrate 12 is not necessary when no layers have to be added on top of the object 25; the object will adhere to the plate 13. The thickness of the object will be determined by the amount of radiation applied to the top of plate 13 and can be less than the depth of the polymer. Alternatively, a mask can be used to modulate radiation, with or without a scanner, to prepare objects that have a thickness less than the depth of the polymer.

The substrate 12 can be of glass, plastic, stainless steel or any other material which will serve as a suitable support to which the solidified object will attach and will not displace when plate 13 is slid off. It can be opaque or transparent as in the case of substrate 12' in the embodiment of FIG. 2.

The plate 13 can be of any sufficiently rigid, radiation-transmitting material which should preferrably exclude air and prevent the surface of the cured photopolymer from forming other than desired shapes. The preferred plate 13 is of glass or similar rigid transparent material; however, it also can be a sufficiently rigid stretched transparent film which possesses the desired properties, with or without a coating 23 (23'), or just a film of material useful as coating 23. The plate 13 could also be a fused bundle of optical fibers (fiber optic faceplate) with one end of each fiber overlying the fluid and the other provided with an optical switch (shutter) controlling passage of radiation from a radiation source according to commands from a computer so that each fiber irradiates for a prescribed period of time and the top surface of the photopolymer is simultaneously irradiated with proper amount of energy. Currently available faceplates utilizing 8 μm diameter interstitial black fibers called EMA provide image resolution of 16 μm.

To modulate the radiation if a source of uniform radiation is used the mask 15 can be employed. The mask 15 may be of any functionally suitable material and it can be comprised of one or more components. The mask 15 may be a part of plate 13 or a separate item positioned preferrably between the plate 13 and coating 23. In a preferred embodiment, mask 15 is a metallic layer on the bottom of plate 13 and is made of microelectronic mask glass.

The transparent coatings 23, 23' can be any material which leaves the irradiated surface of the photopolymer capable of further cross-linking and to which the solidified polymer preferably does not adhere. The preferred material is fluorinated ethylene propylene copolymer, which is available as Teflon FEP in film, adhesive tape and other forms from du Pont of Wilmington, Del. It may be produced by the copolymerization of tetrafluorethelyne and hexafluoropropylene. Another resin that can be used is UHMW polyolefin available from CHR Industries of New Haven, Conn. as an adhesive tape.

Apparatus where plate 13 seals the container are also possible in which case means are provided to allow free photopolymer flow to make up for shrinkage.

In still another embodiment no coating 23 is used in the apparatus of FIG. 1 if the substrate 12 is made of Teflon or other material the polymer does not adhere to. In this embodiment after irradiation the plate 13 with the object attached is slid off the substrate 12 inside the container.

Three-dimensional objects formed by the apparatus of the present invention can be used, in particular, as parts in integrated electric circuit boards. In such case, an insulating medium such as Magnacryl 2296, can be employed to form the structural portion, and the conducting layer can be deposited by metallization with subsequent mask etching, or by another process.

The method of the present invention also can be used to produce more complex objects by building separately a number of three-dimensional portions or slices, that have two surfaces which are capable of further cross-linking and attaching the slices together. They can be then joined by radiation. For best results, it should be done in the absence of oxygen and other inhibitors of cross-linking. The apparatus of the embodiment of FIG. 2 is useful for making such portions or slices as well as the apparatus of FIG. 1 when substrate 12 is made of Teflon or other material preserving cross-linking ability of the polymer. The apparatus of FIG. 4A and 4B having a plate 13, 13' with a coating 23, 23' also can be used.

Figure 5:
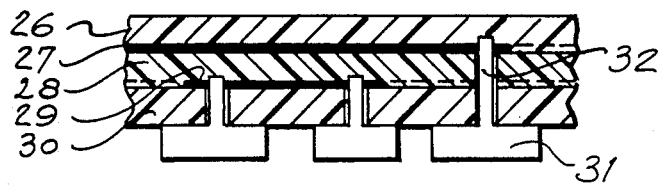
FIG. 5 is a schematic view of an electric circuit board made by the method of the present invention.

Some of the slices or portions may be made from different polymers to provide different mechanical, electrical and other properties. By use of the novel method and apparatus of the present invention, valuable multilayer objects can be made such as integrated electric circuit boards (ECB). An example of such an ECB is shown in FIG. 5 in which 26 is an insulating layer, 27 is a conducting layer, 28 is another insulating layer, 29 is another conductor, 30 is another insulating layer, 31 are electrical components and 32 are pins in one or more slices of solidified photopolymer. Electrical components can be inserted before the desired portion or slice is formed, so that the components can get "soldered" at the time of solidification. Still other advantages and efficiencies of using my method in making such objects will be apparent to those skilled in the art.

Those skilled in the art will appreciate that the cross-linkable surfaces of objects made by the desired method lend themselves to easier deposition of electroconductive layers by other manufacturing methods. For example, fine metal powders can be embedded into cross-linkable surfaces by use of jets through masks; the powders will then be permanently secured upon irradiation.

It also is to be understood that the objects made by the present invention can also include alien objects. The photopolymers readily adhere to many materials, therefore, objects can be formed in situ by irradiating a liquid photopolymer so it will solidify upon an existing part which serves in this case as the substrate. Special container design may be needed, depending on shape and access to existing assembly.

It further will be understood that porous objects can be made by creating pores in the object by proper use of modulated radiation with or without masks. The pores may be of differents sizes and spacing to effect the local density of the object.

While only several preferred embodiments have been shown and described herein, the invention is not intended to be limited thereby but only by the scope of the claims which follow.

I claim:

1. In the method of preparing three-dimensional objects from an uncured photopolymer by treating the photopolymer with radiation to solidify the polymer, the improvement which comprises irradiating said uncured photopolymer by transmitting radiation through a transmittent material in contact with the uncured photopolymer, said material being a material which does not interfere with the solidified photopolymer's ability to subsequently cross-link.

2. The method of claim 1 in which the material is fluorinated ethylene propylene.

3. A method of preparing three-dimensional objects which comprises:
   (a) providing a quantity of an uncured photopolymer in a container;
   (b) placing in contact with said photopolymer a transmittent, relatively rigid member which does not significantly interfere with the subsequent crosslinking of said photopolymer and which can be removed after irradiation; and, (c) then transmitting photopolymer solidifying radiation through said relatively rigid member in an amount effective to cause said photopolymer to solidify to the desired extent.

4. A method of claim 3 in which the relatively rigid member has a transparent coating on its bottom surface, said coating being of a material to which solidified photopolymer does not adhere and which does not significantly interfere with the subsequent cross-linking of the photopolymer.

5. The method of claim 3 which includes the additional steps of:

(d) adding additional uncured photopolymer to cover the solidified photopolymer on the substrate;

(e) positioning a relatively rigid member as in (b); and (f) transmitting photopolymer solidifying radiation through the relatively rigid member in an amount effective to cause additional said photopolymer to solidify to the desired extent and to adhere to said solidified photopolymer.

6. The method of claim 3 in which the object of solidified photopolymer is joined to a similarly prepared object by joining the two objects together along surfaces that are capable of further cross-linking and then irradiating the thus formed combination.

7. A method of claim 3 in which the relatvely rigid member is provided with a mask to modulate radiation.

8. A method of claim 3 in which different amounts of radiation are applied to different areas of the relatively rigid member.

9. An apparatus for porducing of three-dimensional objects from photopolymer, said apparatus comprising:

(a) a quantity of an uncured photopolymer;

(b) a radiation transmittent member having a surface adapted to come into contact with the photopolymer;

(c) means for preserving subsequent cross-linking capability of the photopolymer; and (d) a source of photopolymer solidifying radiation adapted to transmit an effective amount of radiation through said relatively rigid member into said photopolymer so that at least a portion of said photopolymer will solidify.

10. An apparatus of claim 9 in which the rigid member is provided with a mask to modulate radiation.

11. An apparatus of claim 9 in which the rigid member is a bundle of optical fibers.

12. An apparatus of claim 9 in which the means for preserving subsequent cross-linking is a layer of fluorinated ethylene propylene on the surface of the relatively rigid member.

13. An apparatus of claim 9 in which the means for preserving cross-linking is a UHMW polyolefin.

14. An apparatus of claim 9 in which there is a substrate in the container to support solidified photopolymer.

15. An apparatus of claim 9 in which the source of radiation is capable of scanning the rigid member with different amounts of energy.

16. An apparatus of claim 9 in which the source of radiation is a source of ultraviolet light.

17. A method of claim 3 in which the substrate is an alien object to which the solidified photopolymer will permanently adhere.

18. In the method of forming a three-dimensional object by the irradiation of a photopolymer, the improvement which comprises providing a quantity of photopolymer, said quantity being thicker than the object to be formed, covering a surface of said photopolymer with a rigid radiating transmitting member, irradiating each area of said member to form an object of the desired thickness in each area.

19. A method of claim 18 in which the radiation is modulated to produce a porous material.

20. A method of claim 5 in which the substrate is tilted to a desired angle before adding additional polymer.

21. A method of claim 3 in which the object made is an electric integrated circuit board.

22. A method of claim 5 in which the added photopolymer is electrically conductive or insulating.

23. A method of claim 5 in which an electrically conductive material is incorporated into object.

24. A method of producing a three-dimensional object in a container, which comprises irradiating polymer through a radiation transmittent rigid member to cause the polymer to solidify upon a substrate in the container, then sliding the solidified polymer off the substrate while keeping it attached to the rigid member.

25. An apparatus for producing three-dimensional objects from a photopolymer, said apparatus comprising:

(a) a quantity of an uncured photopolymer; and (b) a source of photopolymer solidifying radiation which is capable of varying the amount of radiation it emits to different areas of said photopolymer so that the depth of solidification can be varied in said different areas.

26. An apparatus of claim 9 in which the radiation transmittent member and means for preserving subsequent cross-linking is a single member of a material which is both radiation transmittent and which preserves subsequent cross-linking.

27. An apparatus of claim 9 in which the means for preserving subsequent cross-linking is a layer of material between the radiation transmittent member and the photopolymer.

* * * * *

UNITED STATES PATENT AND TRADEMARK OFFICE
CERTIFICATE OF CORRECTION

PATENT NO. : 4,752,498

DATED : June 21, 1988

INVENTOR(S) : Efrem V. Fudim

It is certified that error appears in the above-identified patent and that said Letters Patent is hereby corrected as shown below:

Column 2, line 24    "cross-linking further" should read --further cross-linking--

Column 6, line 44    "differents" should read --different--

Column 7, line 33    "porducing" should read --producing--

Column 7, line 43    "relatively rigid" should read --radiation transmittent--

Column 7, line 46    "rigid" should read --radiation transmittent--

Column 7, line 48    "rigid" should read --radiation transmittent--

UNITED STATES PATENT AND TRADEMARK OFFICE
CERTIFICATE OF CORRECTION

PATENT NO. : 4,752,498

DATED : June 21, 1988

INVENTOR(S) : Efrem V. Fudim

It is certified that error appears in the above-identified patent and that said Letters Patent is hereby corrected as shown below:

Column 7, lines 52 and 53     "relatively rigid" should read --radiation transmittent--

Column 8, line 5     "rigid" should read --radiation transmittent--

Column 8, line 17     "radiating" should read --radiation--

Signed and Sealed this

Twenty-seventh Day of December, 1988

Attest:

DONALD J. QUIGG

Attesting Officer     Commissioner of Patents and Trademarks

UNITED STATES PATENT AND TRADEMARK OFFICE
CERTIFICATE OF CORRECTION

PATENT NO. : 4,752,498
DATED : June 21, 1988
INVENTOR(S) : Efrem V. Fudim

It is certified that error appears in the above-identified patent and that said Letters Patent is hereby corrected as shown below:

Column 7, line 16    delete "on the substrate"

Column 8, line 9    "the substrate is" should read --said quantity of uncured photopolymer is provided onto--

Column 8, line 22    after "which" insert --said quantity of additional uncured photopolymer is provided on a substrate and--

Signed and Sealed this

Twenty-third Day of May, 1989

*Attest:*

DONALD J. QUIGG

*Attesting Officer*    *Commissioner of Patents and Trademarks*